(12) United States Patent
Ozdemir (10) Patent No.: US 7,830,630 B2
(45) Date of Patent: Nov. 9, 2010

(54) CIRCUIT AND METHOD FOR DETECTING THE PHASE OF A SERVO SIGNAL

(75) Inventor: Hakan Ozdemir, San Jose, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/993,779

(22) Filed: Nov. 5, 2001

(65) Prior Publication Data

US 2003/0030929 A1    Feb. 13, 2003

(51) Int. Cl.
*G11B 5/09* (2006.01)
(52) U.S. Cl. .............................. 360/46; 360/51; 360/75; 360/77.02; 360/78.04
(58) Field of Classification Search .................... 360/29, 360/46, 77.08, 31, 53, 75, 51, 77.02, 78.04, 360/67–68, 77.04
See application file for complete search history.

(56) References Cited

U.S. PATENT DOCUMENTS

| | | | |
|---|---|---|---|
| 3,691,543 A * | 9/1972 | Mueller .................... | 360/77.02 |
| 4,208,679 A | 6/1980 | Hertrich | |
| 4,424,543 A | 1/1984 | Lewis et al. | |
| 4,549,232 A * | 10/1985 | Axmear et al. ........... | 360/77.07 |
| 4,920,434 A | 4/1990 | Brown et al. | |
| 4,979,055 A | 12/1990 | Squires et al. | |
| 5,036,408 A | 7/1991 | Leis et al. | |
| 5,065,262 A | 11/1991 | Blackborrow | |
| 5,216,343 A | 6/1993 | Genheimer et al. | |
| 5,255,136 A | 10/1993 | Machado et al. | |
| 5,291,464 A * | 3/1994 | Osada ...................... | 360/78.07 |
| 5,345,342 A * | 9/1994 | Abbott et al. ................. | 360/48 |
| 5,375,145 A | 12/1994 | Abbott et al. | |
| 5,379,166 A | 1/1995 | Tsukada et al. | |
| 5,381,359 A | 1/1995 | Abbott et al. | |
| 5,384,671 A | 1/1995 | Fisher | |
| 5,424,881 A * | 6/1995 | Behrens et al. ................ | 360/40 |
| 5,430,582 A * | 7/1995 | Hayashi ....................... | 360/51 |
| 5,442,499 A | 8/1995 | Emori | |
| 5,576,904 A | 11/1996 | Behrens | |
| 5,608,583 A * | 3/1997 | Shrinkle ....................... | 360/46 |
| 5,650,887 A * | 7/1997 | Dovek et al. .................. | 360/75 |
| 5,661,760 A | 8/1997 | Patapoutian et al. | |

(Continued)

FOREIGN PATENT DOCUMENTS

EP    0 341 852    11/1989

(Continued)

OTHER PUBLICATIONS

European Search Report for EP 02 25 3862 dated Aug. 28, 2003.

(Continued)

*Primary Examiner*—Dismery E Mercedes
(74) *Attorney, Agent, or Firm*—Lisa K. Jorgenson; Bryan A. Santarelli (57) ABSTRACT

A detector recovers servo data from a servo signal generated by a read-write head, and determines the head-connection polarity from the recovered servo data. Such a detector allows a servo circuit to compensate for a reversed-connected read-write head, and thus allows a manufacturer to forego time-consuming and costly testing to determine whether the head is correctly connected to the servo circuit.

29 Claims, 8 Drawing Sheets

U.S. PATENT DOCUMENTS

| | | | |
|---|---|---|---|
| 5,754,356 A | | 5/1998 | Honjo et al. |
| 5,757,576 A | * | 5/1998 | Kosugi .................... 360/78.14 |
| 5,796,535 A | * | 8/1998 | Tuttle et al. .................... 360/51 |
| 5,796,543 A | | 8/1998 | Ton-That |
| 5,812,336 A | | 9/1998 | Spurbeck et al. |
| 5,818,655 A | | 10/1998 | Satoh et al. |
| 5,818,659 A | | 10/1998 | Cheung |
| 5,822,143 A | * | 10/1998 | Cloke et al. .................... 360/65 |
| 5,844,741 A | | 12/1998 | Yamakawa et al. |
| 5,862,005 A | * | 1/1999 | Leis et al. .................... 360/27 |
| 5,872,666 A | | 2/1999 | Saiki et al. |
| 5,909,336 A | | 6/1999 | Schaffner et al. |
| 5,966,258 A | | 10/1999 | Bliss |
| 6,031,672 A | | 2/2000 | Bergquist et al. |
| 6,032,284 A | | 2/2000 | Bliss |
| 6,038,097 A | | 3/2000 | Le et al. |
| 6,052,248 A | * | 4/2000 | Reed et al. .................... 360/53 |
| 6,078,445 A | | 6/2000 | Serrano et al. |
| 6,084,741 A | | 7/2000 | Kim |
| 6,091,699 A | * | 7/2000 | Nakane et al. ........... 369/275.3 |
| 6,108,151 A | * | 8/2000 | Tuttle et al. .................... 360/51 |
| 6,108,153 A | | 8/2000 | Glover |
| 6,115,198 A | | 9/2000 | Reed et al. |
| 6,122,117 A | | 9/2000 | Aikawa |
| 6,122,131 A | | 9/2000 | Jeppson |
| 6,144,513 A | * | 11/2000 | Reed et al. .................... 360/51 |
| 6,181,505 B1 | | 1/2001 | Sacks et al. |
| 6,201,652 B1 | | 3/2001 | Rezzi et al. |
| 6,233,715 B1 | | 5/2001 | Kuki et al. |
| 6,239,934 B1 | | 5/2001 | Sun et al. |
| 6,262,857 B1 | | 7/2001 | Hull et al. |
| 6,295,175 B1 | * | 9/2001 | Tomita et al. .................. 360/31 |
| 6,295,176 B1 | | 9/2001 | Reddy et al. |
| 6,304,538 B1 | * | 10/2001 | Hayashi .................... 369/59.22 |
| 6,324,030 B1 | | 11/2001 | Cheung et al. |
| 6,327,105 B1 | | 12/2001 | DeForest |
| 6,347,390 B1 | | 2/2002 | Ino |
| 6,366,225 B1 | | 4/2002 | Ozdemir |
| 6,369,969 B1 | * | 4/2002 | Christiansen et al. ......... 360/66 |
| 6,400,288 B1 | | 6/2002 | Fredrickson et al. |
| 6,426,845 B1 | | 7/2002 | Sacks et al. |
| 6,433,948 B1 | | 8/2002 | Lee |
| 6,477,125 B1 | * | 11/2002 | Hayami .................... 369/59.22 |
| 6,487,672 B1 | | 11/2002 | Byrne et al. |
| 6,490,110 B2 | | 12/2002 | Reed et al. |
| 6,492,918 B1 | * | 12/2002 | Rezzi et al. .................... 341/68 |
| 6,507,447 B1 | * | 1/2003 | Takahashi .................... 360/46 |
| 6,519,107 B1 | | 2/2003 | Ehrlich et al. |
| 6,534,974 B1 | * | 3/2003 | Bowen et al. ............... 324/210 |
| 6,560,054 B1 | | 5/2003 | Ottlesen et al. |
| 6,580,573 B1 | | 6/2003 | Hull et al. |
| 6,604,204 B1 | * | 8/2003 | Ozdemir et al. ............. 713/400 |
| 6,606,728 B1 | | 8/2003 | Aziz |
| 6,639,748 B1 | * | 10/2003 | Christiansen et al. ......... 360/66 |
| 6,650,614 B1 | | 11/2003 | Pietruszynski et al. |
| 6,657,800 B1 | | 12/2003 | Ozdemir et al. |
| 6,662,338 B1 | * | 12/2003 | Rezzi et al. .................. 714/795 |
| 6,665,138 B1 | | 12/2003 | Kim |
| 6,680,807 B1 | | 1/2004 | She et al. |
| 6,738,205 B1 | | 5/2004 | Moran et al. |
| 6,775,084 B1 | | 8/2004 | Ozdemir et al. |
| 6,778,345 B1 | | 8/2004 | Ozdemir |
| 6,856,480 B2 | | 2/2005 | Kuki et al. |
| 6,867,941 B1 | | 3/2005 | Ozdemir |
| 6,909,567 B2 | * | 6/2005 | McClellan et al. ............ 360/46 |
| 6,942,918 B2 | * | 9/2005 | MacDougall et al. .... 428/304.4 |
| 7,027,247 B2 | | 4/2006 | Heydari et al. |
| 7,061,704 B2 | * | 6/2006 | Dunn .......................... 360/39 |
| 7,206,149 B2 | | 4/2007 | Ozdemir |
| 7,382,568 B2 | | 6/2008 | Ozdemir |
| 7,423,827 B2 | * | 9/2008 | Neville et al. .................. 360/51 |
| 7,430,082 B2 | | 9/2008 | Heydari et al. |
| 2003/0002189 A1 | | 1/2003 | Ozdemir |
| 2003/0048560 A1 | | 3/2003 | Ozdemir |
| 2003/0048562 A1 | | 3/2003 | Heydari et al. |
| 2003/0053245 A1 | | 3/2003 | Ozdemir |
| 2005/0157415 A1 | * | 7/2005 | Chiang et al. ................. 360/31 |

FOREIGN PATENT DOCUMENTS

| | | |
|---|---|---|
| WO | WO 99/60566 A | 11/1999 |

OTHER PUBLICATIONS

European Search Report for EP 02 25 3883 dated Aug. 28, 2003.
European Search Report for EP 02 25 3885 mailed Nov. 7, 2006.
"The Authoritative Dictionary of IEEE Standard Terms", 7th Ed., 2000, pp. 638.
EP Search Report 02 25 3867, dated Oct. 23, 2006.
Partial European Search Report for European Patent Application No. 02253868.0-2223, dated Feb. 4, 2007.

* cited by examiner

| | | | |
|---|---|---|---|
| TRACKS 22 | TRACK 0 | 0000 | 001100110000 |
| | TRACK 1 | 0001 | 001100110011 |
| | TRACK 2 | 0011 | 001100000011 |
| | TRACK 3 | 0010 | 001100000110 |
| | TRACK 4 | 0110 | 001100001100 |
| | TRACK 5 | 0111 | 001100011000 |
| | TRACK 6 | 0101 | 000110011000 |
| | TRACK 7 | 0100 | 000110001100 |
| | TRACK 8 | 1100 | 000110000110 |
| | TRACK 9 | 1101 | 000110000011 |
| | TRACK 10 | 1111 | 000011000011 |
| | TRACK 11 | 1110 | 000011000110 |
| | TRACK 12 | 1010 | 000001100110 |
| | TRACK 13 | 1011 | 000001100011 |
| | TRACK 14 | 1001 | 000000110011 |
| | TRACK 15 | 1000 | 000000110000 |
| | | 52 | 50 |

| TRACK 0 | 000 | 000000000000 |
| TRACK 1 | 001 | 000000000011 |
| TRACK 2 | 011 | 000000110011 |
| TRACK 3 | 010 | 000000110000 |
| TRACK 4 | 110 | 001100110000 |
| TRACK 5 | 111 | 001100110011 |
| TRACK 6 | 101 | 001100000011 |
| TRACK 7 | 100 | 001100000000 |
|         | 132 | 130          |

CIRCUIT AND METHOD FOR DETECTING THE PHASE OF A SERVO SIGNAL

CROSS-REFERENCE TO RELATED APPLICATIONS

This application is related to commonly owned U.S. Patent App. Ser. Nos. 60/301,505 entitled "DATA-STORAGE DISK HAVING FEW OR NO SPIN-UP WEDGES AND METHOD FOR WRITING SERVO WEDGES ONTO THE DISK," 60/301,504 entitled "CIRCUIT AND METHOD FOR DETECTING A SERVO WEDGE ON SPIN UP OF A DATA-STORAGE DISK", 60/301,469 entitled "CIRCUIT AND METHOD FOR DETECTING A SPIN-UP WEDGE AND A CORRESPONDING SERVO WEDGE ON SPIN UP OF A DATA-STORAGE DISK", 60/301,506 entitled "A DATA CODE AND METHOD FOR CODING DATA", 60/301,489 entitled "CIRCUIT AND METHOD FOR DEMODULATING A SERVO POSITION BURST", 60/301,503 entitled "SERVO CIRCUIT HAVING A SYNCHRONOUS SERVO CHANNEL AND METHOD FOR SYNCHRONOUSLY RECOVERING SERVO DATA," which were filed on the same day as the present application and which are incorporated by reference.

TECHNICAL FIELD OF THE INVENTION

The invention is related generally to recovering data, and more particularly to a circuit and method for detecting the phase of a servo signal so that a servo circuit can compensate for a reverse-connected read head.

BACKGROUND OF THE INVENTION

As computer-software applications become larger and more data intensive, disk-drive manufacturers often increase the data-storage capacities of data-storage disks by increasing the density of the stored servo and application data.

To increase the accuracy of a servo circuit as it reads the denser servo data from a data-storage disk, the manufacturer often codes the servo data. For example, as discussed below in conjunction with FIG. 4, the manufacturer may use a Gray code to code the servo data.

Unfortunately, if the manufacturer codes the servo data stored on a data-storage disk, then a disk drive that incorporates the disk often cannot incorporate conventional techniques—such as NRZ(Non Return to Zero)-NRZI (Non Return to Zero Interleave)-NRZ conversion—to compensate for a reverse-connected read head.

Figure 1:
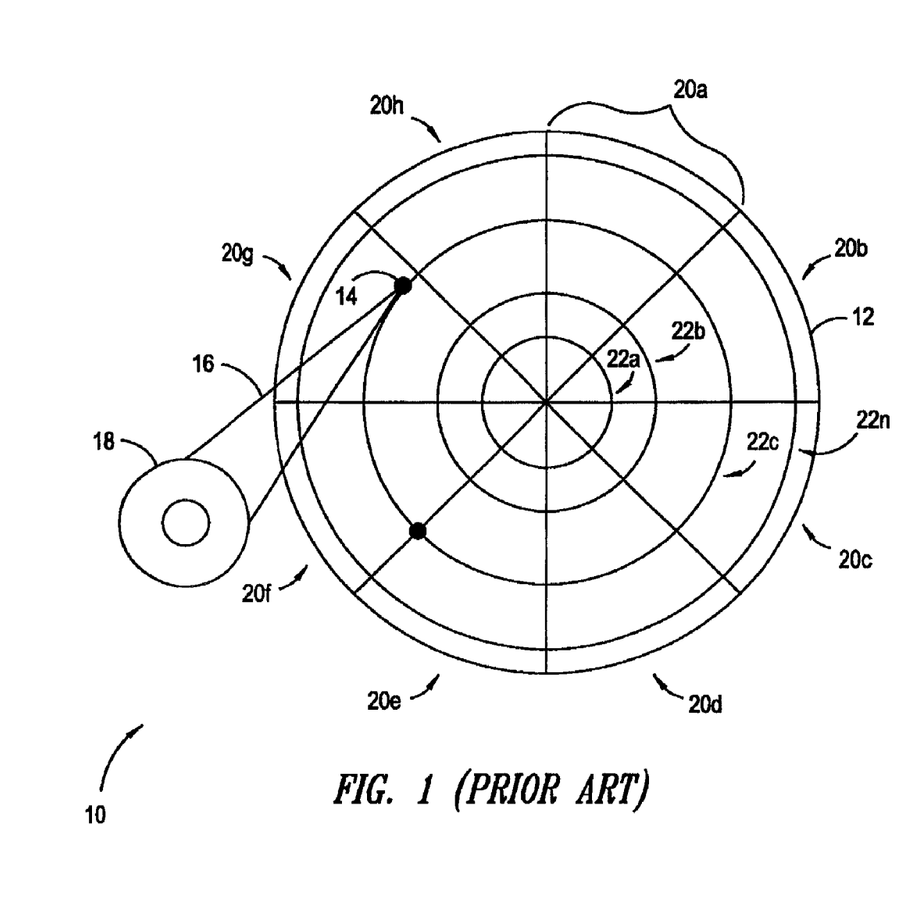
FIG. 1 is a plan view of a conventional disk drive that includes a magnetic data-storage disk having disk sectors and data tracks.

FIG. 1 is a plan view of a conventional disk drive 10, which includes a magnetic data-storage disk 12, a read-write head 14, an arm 16, and a voice-coil motor 18. The disk 12 is partitioned into a number—here eight—of disk sectors 20a-20h, and includes a number—typically in the tens or hundreds of thousands—of concentric data tracks 22a-22n. Readable-writable application data is stored in respective data sectors (not shown) within each track 22. Under the control of the disk drive's head-position circuit (not shown in FIG. 1), the motor 18 moves the arm 16 to center the head 14 over a selected track 22.

Figure 2:
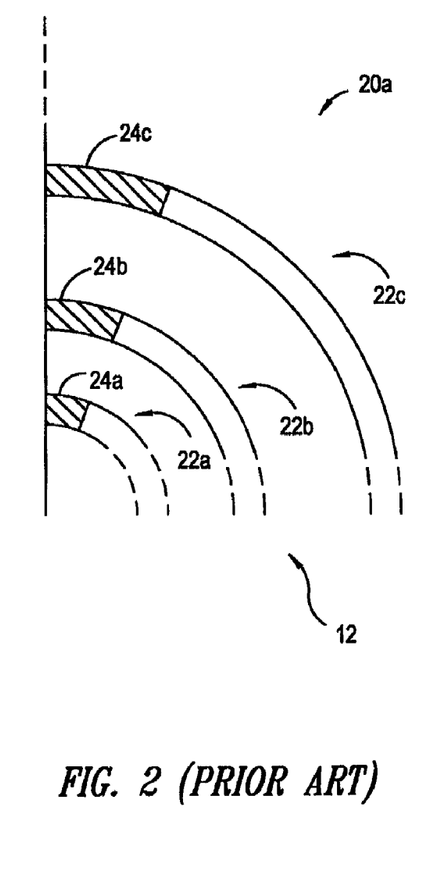
FIG. 2 is a magnified view of the servo wedges on the disk of FIG. 1.

Referring to FIG. 2, conventional data servo wedges 24—only servo wedges 24a-24c are shown—include servo data that allows the head-position circuit (not shown in FIG. 2) of the disk drive 10 (FIG. 1) to accurately position the read-write head 14 (FIG. 1) during a data read or write operation. The servo wedges 24 are located within each track 22 at the beginning—the disk 12 spins counterclockwise in this example—of each disk sector 20. Each servo wedge 24 includes respective servo data that indentifies the location (track 22 and sector 20) of the servo wedge. Thus, the head-position circuit uses this servo data to position the head 14 over the track 22 selected to be read from or written to. The manufacturer of the disk drive 10 typically writes the servo wedges 24 onto the disk 12 before shipping the disk drive to a customer; neither the disk drive nor the customer alters the servo wedges 24 thereafter. Servo wedges like the servo wedges 24 are further discussed below in conjunction with FIG. 3 and in commonly owned U.S. patent application Ser. No. 09/783,801, filed Feb. 14, 2001, entitled "VITERBI DETECTOR AND METHOD FOR RECOVERING A BINARY SEQUENCE FROM A READ SIGNAL," which is incorporated by reference.

Figure 3:
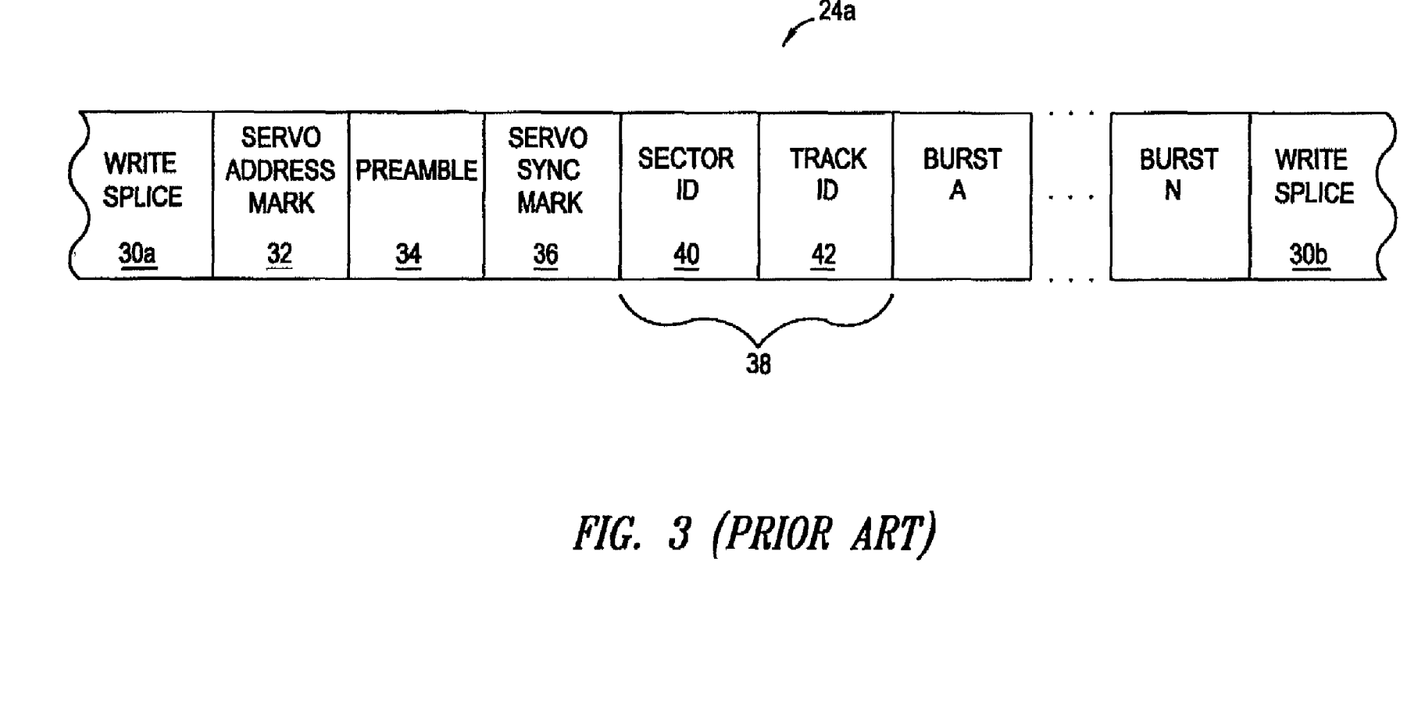
FIG. 3 is a diagram of a servo wedge of FIG. 2.

FIG. 3 is a diagram of the servo wedge 24a of FIG. 2, the other servo wedges 24 being similar. Write splices 30a and 30b respectively separate the servo wedge 24a from adjacent data sectors (not shown). An optional servo address mark (SAM) 32 indicates to the head-position circuit (not shown in FIG. 3) that the read-write head 14 (FIG. 1) is at the beginning of the servo wedge 24a. A servo preamble 34 allows the servo circuit (not shown in FIG. 3) of the disk drive 10 (FIG. 1) to synchronize the sample clock to the servo signal (FIG. 5), and a servo synchronization mark (SSM) 36 identifies the beginning of a head-location identifier 38. The preamble 34 and SSM 36 are discussed in commonly owned U.S. Patent application Nos. 60/301,505 entitled "DATA-STORAGE DISK HAVING FEW OR NO SPIN-UP WEDGES AND METHOD FOR WRITING SERVO WEDGES ONTO THE DISK," 60/301,504 entitled "CIRCUIT AND METHOD FOR DETECTING A SERVO WEDGE ON SPIN UP OF A DATA-STORAGE DISK", 60/301,469 entitled "CIRCUIT AND METHOD FOR DETECTING A SPIN-UP WEDGE AND A CORRESPONDING SERVO WEDGE ON SPIN UP OF A DATA-STORAGE DISK", 60/301,503 entitled "SERVO CIRCUIT HAVING A SYNCHRONOUS SERVO CHANNEL AND METHOD FOR SYNCHRONOUSLY RECOVERING SERVO DATA", which are incorporated by reference. The location identifier 38 allows the head-position circuit to coarsely determine and adjust the position of the head 14 with respect to the surface of the disk 12 (FIG. 1). More specifically, the location identifier 38 includes a sector identifier 40 and a track identifier 42, which respectively identify the disk sector 20 and the data track 22—here the sector 20a and the track 22a—that contain the servo wedge 24a. Because the head 14 may read the location identifier 38 even if the head is not centered over the track 24a, the servo wedge 24a also includes head-position bursts A-N, which allow the head-position circuit to finely determine and adjust the position of the head 14.

Figure 4:
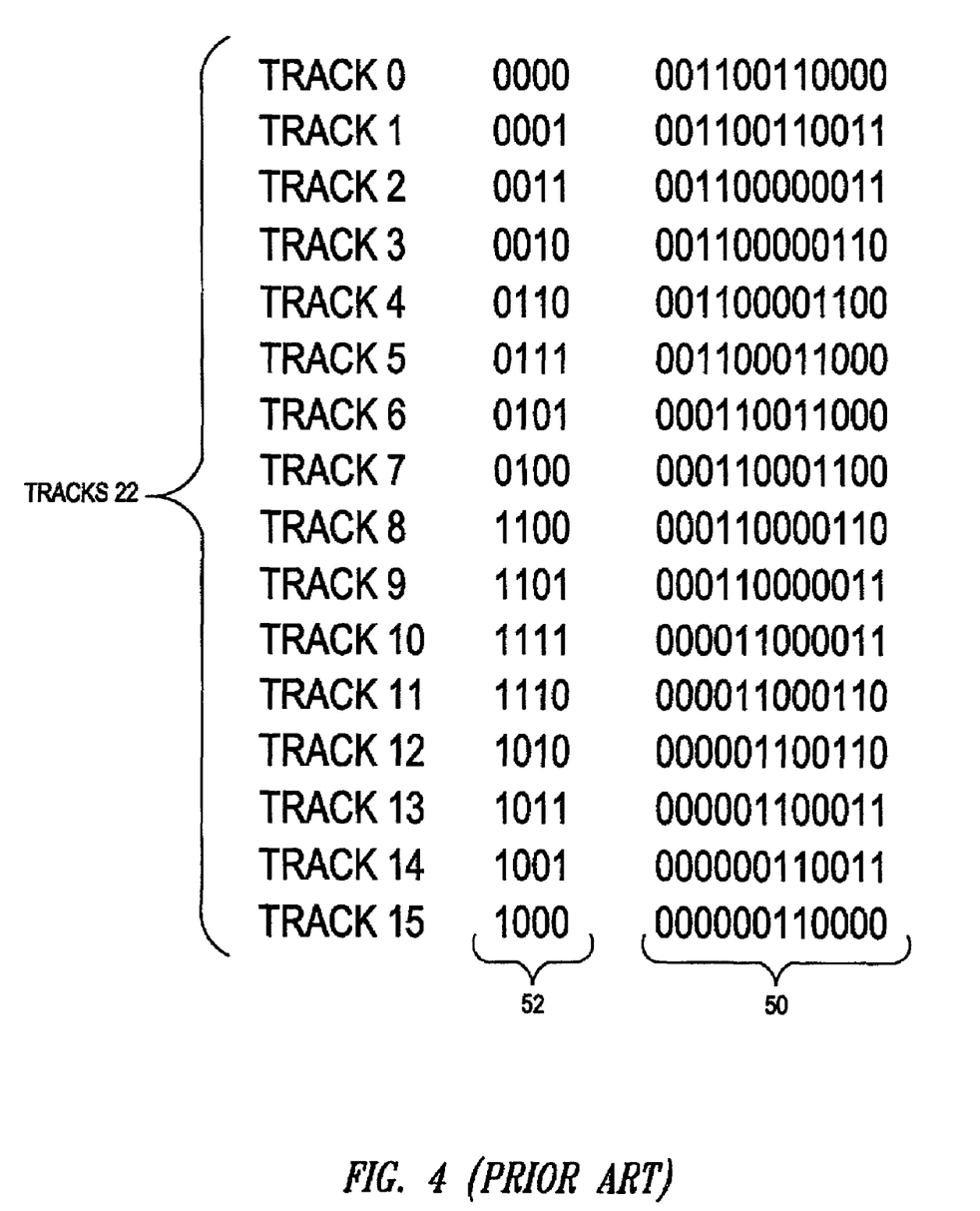
FIG. 4 is a table of conventional Gray coded track identifiers and the corresponding uncoded track identifiers for adjacent tracks on the disk of FIG. 1.

FIG. 4 is a table of the Gray coded bit patterns 50 that form portions of the respective track identifiers 42 (FIG. 3) for sixteen adjacent tracks 0-15 (FIG. 2) and the corresponding uncoded bit patterns 52. The uncoded patterns 52 for adjacent tracks differ by only one bit. For example, the only difference between the patterns 52 for the tracks 0 and 1 is that the least significant (rightmost) bit for track 0 is logic 0, and the least significant bit for track 1 is logic 1. Similarly, the Gray coded patterns 50 for adjacent tracks differ by only a pair of bits, or a one-bit shift in a pair of logic 1's. For example, the only difference between the patterns 50 for the tracks 0 and 1 is that the pair of least significant bits for track 0 are logic 0, and the pair of least significant bits for track 1 are logic 1. Moreover, the only difference between the patterns 50 for tracks 2 and 3 are that the pair of least significant logic 1's in the pattern 50 for track 2 are shifted left by one bit in the pattern 50 for track 3.

Still referring to FIG. 4, the Gray coded patterns 50 allow the head-position circuit (not shown in FIG. 4) to determine the position of the read-write head 14 (FIG. 1) within ±1 track. More specifically, the tracks 22 (FIG. 1) are typically so close together that the head 14 often simultaneously picks up servo data from multiple tracks 22, particularly if the head is between two tracks 22. Consequently, the Gray coded patterns 50 are designed so that if the head 14 is between two tracks 22, it generates a servo signal (not shown in FIG. 4) that ideally represents the Gray coded pattern 50 of the closest of these two tracks, but of no other track. For example, if the head 14 is between tracks 2 and 3 but closer to the center of track 2 than to the center of track 3, then the servo signal ideally represents the coded pattern 50 in track 2. If there is noise or another disturbance on the servo signal, however, then a servo circuit (not shown in FIG. 4) may read the servo signal as representing track 3, hence the ±1 track accuracy in the position of the head 14. The head-position circuit uses this head-position information derived from the servo signal to position the head 14 over a desired track 22. Once the head-position circuit positions the head 14 over a desired track 22 such that the servo signal represents the pattern 50 of the desired track, the head-position circuit uses bursts A-N (FIG. 3) to center the head 14 over the desired track.

Referring again to FIG. 1, during the manufacture of the disk drive 10 the head 14 may be reverse connected, in which case it reverses the phase of, i.e., inverts, the servo data as it reads a servo wedge 24 (FIG. 2). Although not shown, the head 14 typically has two leads that are connected to a servo circuit (not shown in FIGS. 1-4). The person or machine that assembles the disk-drive 10 may reverse the leads. If the leads are reversed, then the head 14 will invert the servo signal, and thus the servo data. Consequently, if left uncorrected, the inverted servo data may cause the disk drive 10 to malfunction. Although the manufacture can test the disk drive 10 and reconnect the head leads if they are reversed, such testing is often costly and time consuming.

As discussed above, techniques such as NRZ-NRZI-NRZ conversion are often used to compensate for a reverse-connected read-write head 14. For example, the NRZ-NRZI-NRZ conversion converts data from one state to another such that the polarity of the resulting data recovered from the disk 12 (FIG. 1) is the same whether the leads of the head 14 are properly or reverse connected. That is, NRZ-NRZI-NRZ conversion eliminates the need to test the head connection because the recovered data has the correct polarity regardless of the polarity of the connection.

Unfortunately, referring to FIG. 4, NRZ-NRZI-NRZ conversion cannot be used with the Gray coded patterns 50 because it will destroy the characteristics of the patterns 50 that allow the head-position circuit (not shown in FIGS. 1-4) to determine the position of the read-write head 14 (FIG. 1) with ±1 track accuracy.

SUMMARY OF THE INVENTION

In one aspect of the invention, a head-polarity detector includes a circuit for recovering servo data and a polarity determinator. The circuit recovers the servo data from a servo signal generated by a read-write head that is coupled to the circuit with a coupling polarity. The determinator determines the coupling polarity from the recovered servo data.

Such a detector allows a servo circuit to compensate for a reversed-coupled read-write head, and thus allows a manufacturer to forego time-consuming and costly testing of the head-connection polarity.

DESCRIPTION OF THE INVENTION

Figure 5:
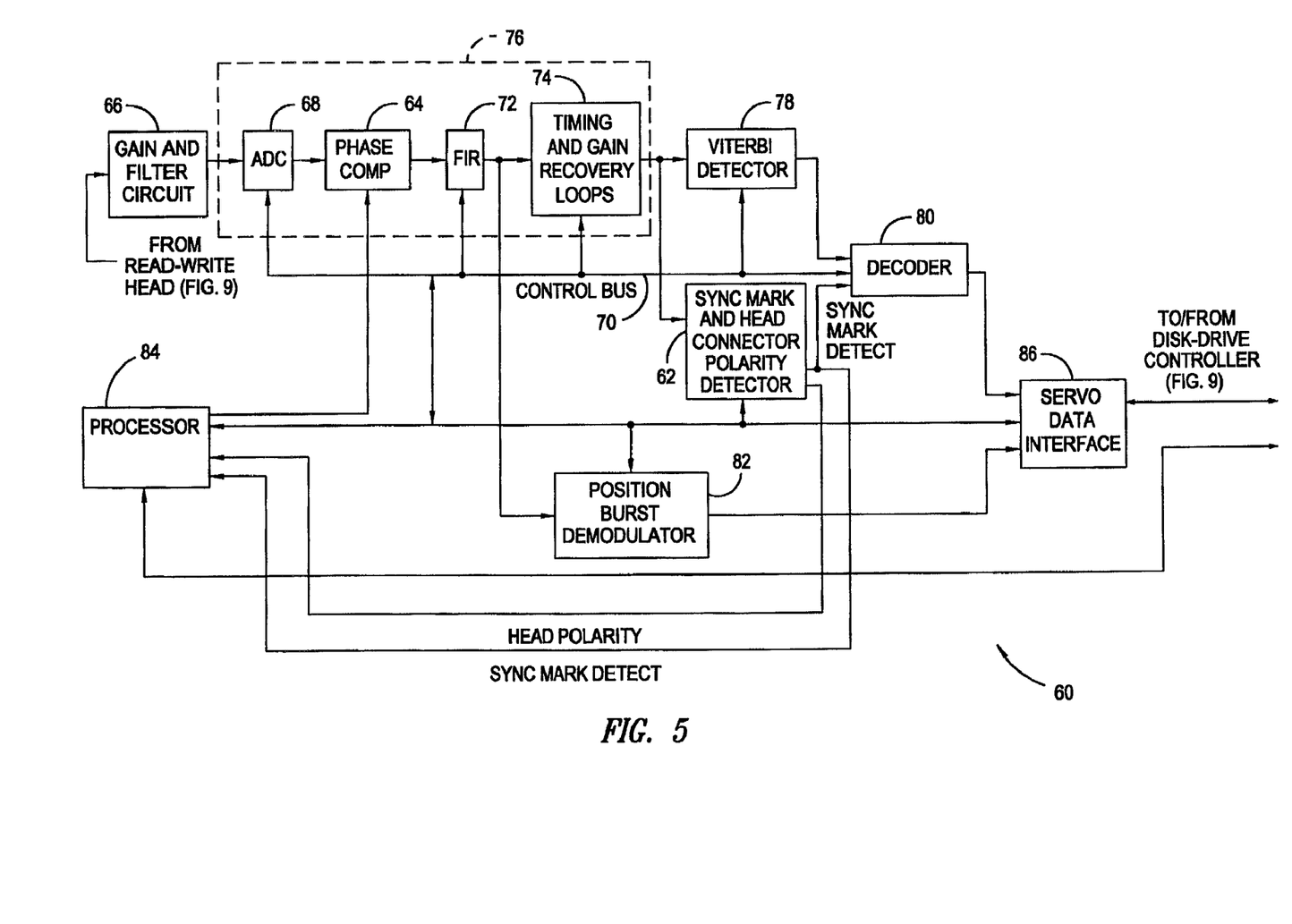
FIG. 5 is a block diagram of a servo circuit that can determine the polarity of a read-write head connection and can compensate the servo signal if the connection is reversed according to an embodiment of the invention.

FIG. 5 is block diagram of a synchronous servo circuit 60, which in accordance with an embodiment of the invention includes a synchronization-mark-and-polarity detector 62 for recovering a synchronization mark such as the sync mark of Table 1 below, determining the connection polarity of a read-write head (FIG. 9) from the recovered sync mark, and causing a phase-compensation circuit 64 to adjust the phase of the servo signal if the head connection is reversed. The detector 62 is further discussed below in conjunction with FIG. 6, and in one embodiment, the detector 62 includes a polarity-independent first Viterbi detector 100 and the circuit 64 includes a conventional twos-compliment inverter.

Figure 9:
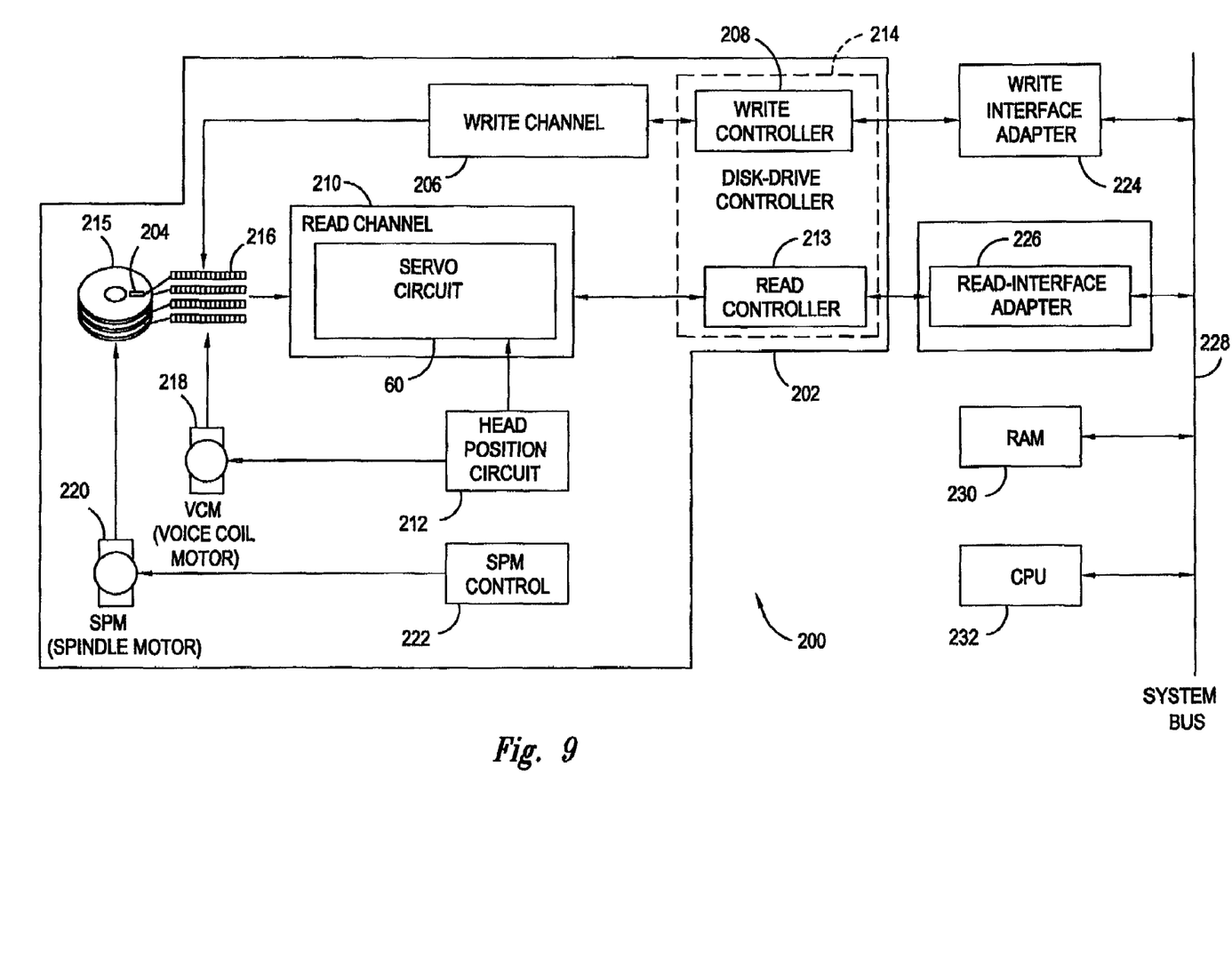
FIG. 9 is a block diagram of a disk-drive system that incorporates the servo circuit of FIG. 5 and that may incorporate the Gray coded track identifiers of FIG. 8 according to an embodiment of the invention.

The circuit 60 also includes a gain and filter circuit 66, which adjusts the gain of, filters, and equalizes the servo signal from the read-write head (FIG. 9). An analog-to-digital converter (ADC) 68 receives a sample clock (not shown) on a control bus 70 and generates digital samples of the servo signal from the circuit 66. A finite-impulse-response (FIR) filter 72 boosts the equalization of the samples received from the ADC 68 via the phase-compensation circuit 64, and timing and gain recovery loops 74 effectively synchronize the sample clock to the servo signal and maintain the gain of the circuit 60 at a desired level. The phase-compensation circuit 64, ADC 68, FIR 72, and loops 74 form a sample circuit 76. A second Viterbi detector 78 recovers servo data, such as the location identifier 38 (FIG. 3), from the servo-signal samples generated by the loops 74. A decoder 80 decodes the recovered servo data from the Viterbi detector 78 in response to a Sync Mark Detect signal from the detector 62. A position-burst demodulator 82 receives samples of the servo signal from the FIR 72 and generates a head-position-error signal, and a processor 84 controls the components of the servo circuit 60 via the control bus 70. For example, the processor 84 causes the circuit 64 to invert the samples from the ADC 68 in response to a predetermined logic level of a Head Polarity signal from the detector 62. A servo-data interface 86 interfaces the decoder 80, demodulator 82, and processor 84 to a disk-drive controller (FIG. 9). Alternatively, as discussed below, depending on the scheme used to code the servo data, the circuit 60 may omit the second Viterbi detector 78 and use the detector 62 to recover all of the servo data. Furthermore, although shown located between the ADC 68 and the FIR 72, the phase-compensation circuit 64 may be located elsewhere in the forward path of the servo circuit 60 such as at the input of the Viterbi detector 78.

Still referring to FIG. 5, the circuit 66, ADC 68, FIR 72, loops 74, Viterbi detector 78, decoder 80, processor 84, and the general operation of the servo circuit 60 are further discussed in previously incorporated U.S. Patent App. Ser. Nos. 60/301,505 entitled "DATA-STORAGE DISK HAVING FEW OR NO SPIN-UP WEDGES AND METHOD FOR WRITING SERVO WEDGES ONTO THE DISK," 60/301, 504 entitled "CIRCUIT AND METHOD FOR DETECTING A SERVO WEDGE ON SPIN UP OF A DATA-STORAGE DISK", 60/301,469 entitled "CIRCUIT AND METHOD FOR DETECTING A SPIN-UP WEDGE AND A CORRESPONDING SERVO WEDGE ON SPIN UP OF A DATA-STORAGE DISK", 60/301,503 entitled "SERVO CIRCUIT HAVING A SYNCHRONOUS SERVO CHANNEL AND METHOD FOR SYNCHRONOUSLY RECOVERING SERVO DATA". The timing-recovery loop of the loops 74 is further discussed in commonly owned U.S. patent application Ser. No. 09/387,146, filed Aug. 31, 1999, entitled "DIGITAL TIMING RECOVERY USING BAUD RATE SAMPLING", which is incorporated by reference, and the gain-recovery loop of the loops 74 and the Viterbi detector 78 are also discussed in previously incorporated patent application Ser. No. 09/783,801, filed Feb. 14, 2001, entitled "VITERBI DETECTOR AND METHOD FOR RECOVERING A BINARY SEQUENCE FROM A READ SIGNAL". The burst demodulator 82 is discussed in previously incorporated U.S. Patent App. Ser. No. 60/301,489 entitled "CIRCUIT AND METHOD FOR DEMODULATING A SERVO POSITION BURST".

Figure 6:
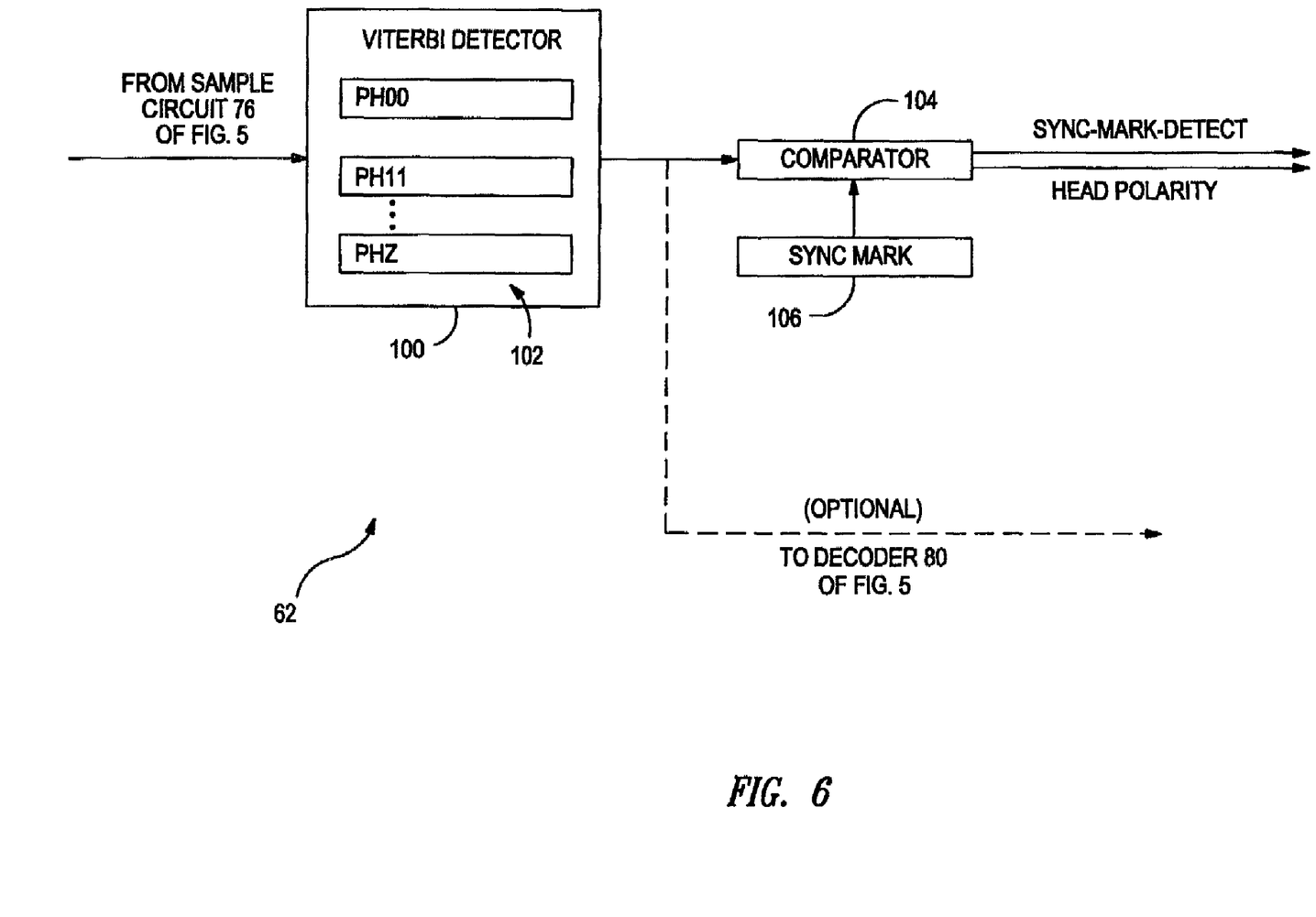
FIG. 6 is a block diagram of the synchronization-mark-and-polarity detector of FIG. 5 according to an embodiment of the invention.

FIG. 6 is a block diagram of the synchronization-mark-and-polarity detector 62 of FIG. 5 according to an embodiment of the invention. The detector 62 includes the polarity-independent first Viterbi detector 100, which recovers the sync mark from the servo signal regardless of the head-connection polarity and which includes a bank 102 of path-history registers PH00-PHZ, one register for each state that the Viterbi detector 100 recognizes. A comparator 104 detects the sync mark and the head-connection polarity by comparing the recovered servo data from the Viterbi detector 100 with the noninverted version of the sync mark stored in a register 106. The comparator 104 generates the Sync Mark Detect signal having one logic level when it detects the sync mark and another logic level otherwise, and generates the Head Polarity signal having one logic level when the head is properly connected to the servo circuit 60 (FIG. 5) and another logic level when the head connection is inverted. Alternatively, where the second Viterbi detector 78 (FIG. 5) is omitted, the servo circuit 60 (FIG. 5) uses the first Viterbi detector 100 to recover all of the servo data and to provide the recovered servo data to the decoder 80.

Referring to FIGS. 5 and 6, the operation of the servo circuit 60 and the sync-mark-and-polarity detector 62 according to an embodiment of the invention is discussed.

At the beginning of a read or write cycle, the servo circuit 60 synchronizes itself to the preamble of a servo wedge such as the preamble 34 of the servo wedge 24a (FIG. 3). Specifically, while the read-write head (FIG. 9) is reading the preamble, the processor 84 causes the timing and gain recovery loops 74 to effectively synchronize the sample clock such that the ADC 68 samples the preamble at appropriate times. This synchronization is further discussed in commonly owned U.S. patent application Ser. No. 09/387,146, filed Aug. 31, 1999, entitled "DIGITAL TIMING RECOVERY USING BAUD RATE SAMPLING", which is incorporated by reference.

When the circuit 60 is synchronized, the processor 84 enables the detector 62 to search for and detect the sync mark and the head-connection polarity. During this search, the comparator 104 compares the recovered servo data from the Viterbi detector 100 to the stored sync mark on a bit-by-bit basis. If and when the number of the recovered servo bits that match the corresponding bits of the stored sync mark is greater than or equal to a first predetermined threshold or less than or equal to a second predetermined threshold, then the comparator transitions the Sync Mark Detect signal to an active logic level to indicate that it has detected the sync mark. Furthermore, the comparator 104 transitions the Head Polarity signal to one logic level if the number of matched bits is greater than or equal to the first threshold, and transitions to the Head Polarity signal to another logic level if the number of matched bits is less than or equal to the second threshold. In one embodiment, the detector 62 allows the manufacturer to program the first and second predetermined thresholds to desired values. Furthermore, as discussed above in conjunction with FIG. 6 and below in conjunction with FIGS. 7A-7C, the Viterbi detector 100 is phase independent such that it can recover the sync mark from the servo data regardless of the connection polarity of the read-write head.

More specifically, the detector 62 detects the sync mark and determines the head-connection polarity according to the following algorithm:

$$\text{If} \sum_{i=0}^{SM\_length-1} SM(i) \oplus SM\_recovered(i) \geq SM\_length - \text{Threshold}$$

Then INV=1 (to indicate that this first comparison indicates recovery of the sync mark and that the head connection is inverted);

Else, INV=0 (to indicate that this first comparison does not indicate recovery of the sync mark and does not provide an indication of the head-connection polarity); and $$\text{If} \sum_{i=0}^{SM\_length-1} SM(i) \oplus SM\_recovered(i) \leq \text{Threshold}$$

NINV=1 (to indicate that this second comparison indicates recovery of the sync mark and that the head connection is not inverted);

Else, NINV=0 (to indicate that this second comparison does not indicate recovery of the sync mark and does not provide an indication of the head-connection polarity).

where SM_length equals the number of bits in the sync mark, SM equals the sync mark stored in the register 106, SM_recovered equals the sync mark recovered from the Viterbi detector 100, Threshold is the second predetermined threshold discussed above, and SM-length−Threshold is the first predetermined threshold discussed above.

For example, if the SM_length=10, SM=0000110011, SM_recovered equals 0100110011, and Threshold=2, then the summation of the algorithm equals the following:

$$0\oplus 0+0\oplus 1+0\oplus 0+0\oplus 0+1\oplus 1+1\oplus 1+0\oplus 0+0\oplus 0+1\oplus 1+1\oplus 1=1 \quad (1)$$

Because 1<(Threshold=2)<(SM-length−Threshold=8), the comparator 104 sets INV=0 and NINV=1, which indicates that the circuit 62 has detected the sync mark and has determined that the head-connection polarity is not inverted. Consequently, the comparator 104 sets the Sync Mark Detect signal to a logic level that indicates that the sync mark is detected, and sets the Head Polarity signal to a logic level that indicates that the head connection is proper. In response to these logic levels, the processor 84 causes the phase compensator 64 to pass through the samples from the ADC 68 without altering the phase of the samples.

But if, for example, SM_recovered=1011001100, and the values of SM, SM-length, and Threshold are the same as above, then the summation of the algorithm equals the following:

$$0\oplus 1+0\oplus 0+0\oplus 1+0\oplus 1+1\oplus 0+1\oplus 0+0\oplus 1+0\oplus 1+1\oplus 0+1\oplus 0=9 \quad (2)$$

Because 9>(SM_length−Threshold=8)>(Threshold=2), the comparator 104 sets INV=1 and NINV=0, which indicates that the circuit 62 has detected the sync mark and has determined that the head-connection polarity is inverted. Consequently, the comparator 104 sets the Sync Mark Detect signal to the logic level that indicates that the sync mark is detected, and sets the Head Polarity signal to a logic level that indicates that the head connection is inverted. In response to these logic levels, the processor 84 causes the phase compensator 64 to invert the samples from the ADC 68. Alternatively, the manufacturer may disable the processor 84 from causing the compensator 64 to invert the samples, and instead swap the head leads in response to these logic levels so that the head is properly connected to the servo circuit 60.

Alternatively, if SM_recovered=1001001101 and the values of SM, SM-length, and Threshold are the same as above, then the summation of the algorithm equals the following:

$$0\oplus 1+0\oplus 0+0\oplus 0+0\oplus 1+1\oplus 1+0\oplus 0+0\oplus 1+0\oplus 1+1\oplus 0+1\oplus 1=7 \quad (3)$$

Because (Threshold=2)<7<(SM_length−Threshold=8), the comparator 104 sets INV=NINV=0, which indicates that the circuit 62 has not detected the sync mark and has not determined the head-connection polarity. Consequently, the comparator 104 sets the Sync Mark Detect to a logic level that indicates that the sync mark has not been detected. In response to this logic level, the processor 84 ignores the Head Polarity signal and does not alter the setting (invert/noninvert) of the phase compensator 64 or instruct a technician to swap the head leads.

Although in the above examples one predetermined threshold (SM_length−Threshold) equals the difference between the length of the sync mark and the other predetermined threshold (Threshold), the one threshold may have a value that is independent of the other threshold. In one embodiment, the two thresholds are set based on the levels of noise and interference expected in the servo signal.

Still referring to FIGS. 5 and 6, because in one embodiment the Viterbi detector 78 recovers servo data following the sync mark—the location identifier 38 (FIG. 3) for example—before the detector 62 can determine the head-connection polarity, the decoder 80 discards the recovered servo data if the detector 62 determines that the head-connection polarity is reversed. This is because the detector 78 cannot properly recover inverted servo data. The processor 84 notifies the disk-drive controller (FIG. 9) that the decoder 80 has discarded servo data, and the controller instructs the servo circuit 60 to restart the read or write cycle with the phase compensator 64 inverting the samples of the servo signal. Because restarting a read or write cycle is inefficient, the manufacturer typically programs the disk-drive controller to cause the servo circuit 60 to determine the head-connection polarity and set the phase-compensation circuit 64 during startup of the disk drive (FIG. 9), and to thereafter disable the circuit 60 from determining the head-connection polarity. For example, the disk-drive controller may cause the processor 84 to store the value of the Head Polarity signal during startup, set the phase-compensation circuit 64 appropriately based on this stored polarity value, and thereafter maintain the setting of the circuit 64 and ignore the Head Polarity signal.

Conversely, in an embodiment where the servo data is coded such that the Viterbi detector 100 can recover both the sync mark and the other servo data, the polarity-detection capability of the comparator 104 can be omitted because the detector 100 is polarity independent. The servo circuit 60, however, may include a data inverter (not shown) between the detector 62 and the decoder 80, or at the output of the decoder 80, so that the recovered servo data will be in a proper form for the disk-drive controller (FIG. 9) if the head connection is inverted. An example of such a servo-data code is discussed below in conjunction with FIG. 8.

Figure 7A:
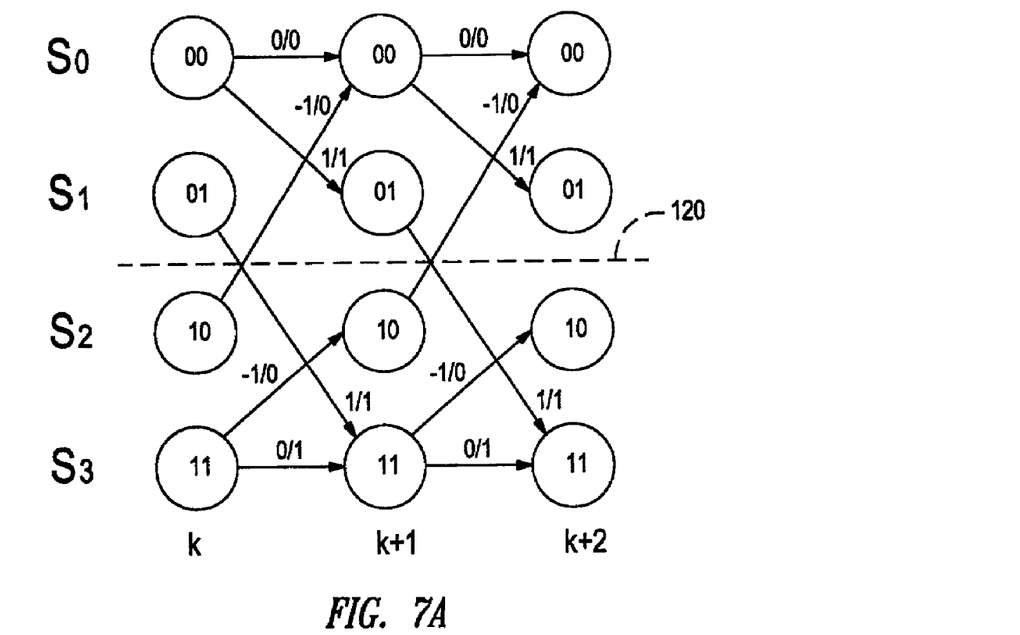
FIG. 7A is a one-sample-at-a-time trellis diagram for a pruned, non-time-varying version of the Viterbi detector of FIG. 6 according to an embodiment of the invention.

FIG. 7A is a one-state-at-a-time trellis diagram for the Viterbi detector 100 of FIG. 5 according to an embodiment of the invention where the sync mark includes pairs and only pairs of consecutive logic 1's that are separated by no fewer than two consecutive logic 0's. In one embodiment, the Viterbi detector 100 is a pruned, non-time-varying PR4 detector where the values to the left of the slashes are the ideal PR4 sample values, the values to the right of the slashes are the possible values of the most recent bit sampled, and k, k+1, and k+2 are the relative sample times. In one application, the sync mark has the bit pattern given in Table 1.

TABLE I

| Sync Mark Bit Pattern |
|---|
| 00000000110000001100001 |

The bit scheme of the sync mark allows the Viterbi detector 100 to have a reduced number of possible state transitions, i.e., to be "pruned." Normally, each state S0-S3 of the trellis diagram would have two entering branches for a total of eight branches between the states at consecutive sample times. But with the restriction on the sync-mark bit pattern described above, there can be no state transition from S1 to S2 or from S2 to S1. Therefore, eliminating these two state transitions leaves only six branches between the states at consecutive sample times.

Furthermore, because the trellis of the Viterbi detector 100 is symmetrical about an imaginary horizontal axis 120 between states S1 and S2, the Viterbi detector 100 can recover the sync mark regardless of its polarity, and thus regardless of the head-connection polarity.

The fundamentals of Viterbi detectors and trellis diagrams are further discussed in commonly owned U.S. patent application Ser. No. 09/409,923, filed Sep. 30, 1999, entitled "PARITY-SENSITIVE VITERBI DETECTOR AND METHOD FOR RECOVERING INFORMATION FROM A READ SIGNAL", and Ser. No. 09/410,274, filed Sep. 30, 1999, entitled "CIRCUIT AND METHOD FOR RECOVERING SYNCHRONIZATION INFORMATION FROM A SIGNAL", which are incorporated by reference.

Figure 7B:
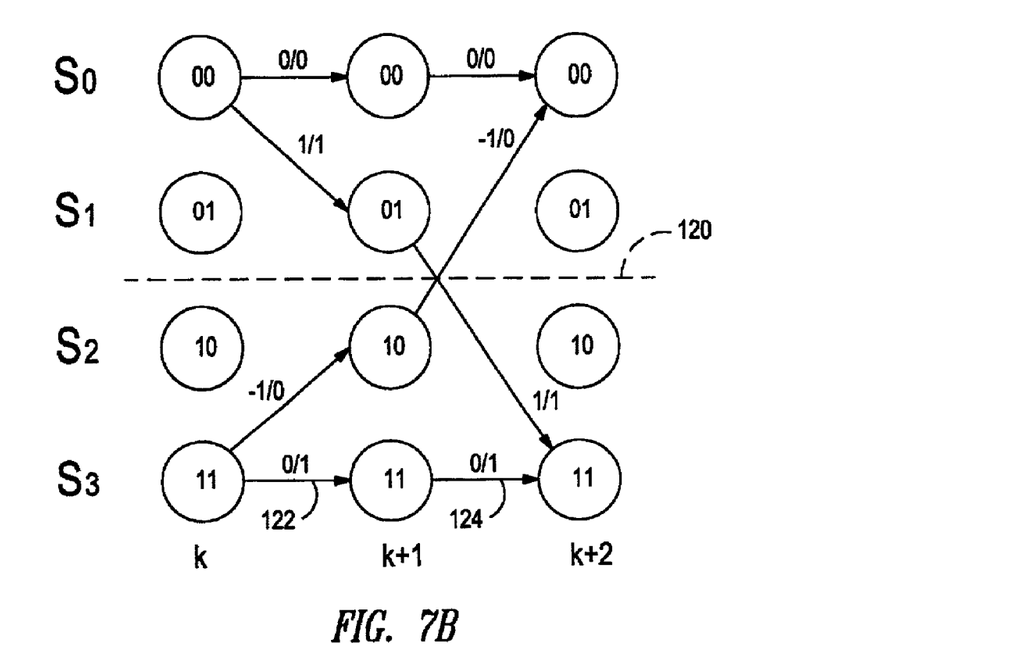
FIG. 7B is a one-sample-at-a-time trellis diagram for a pruned, time-varying version of the Viterbi detector of FIG. 6 according to an embodiment of the invention.

FIG. 7B is a one-state-at-a-time trellis diagram for the Viterbi detector 100 of FIG. 5 according to another embodiment of the invention where the sync mark includes pairs and only pairs of consecutive logic 1's that are separated by no fewer than two consecutive logic 0's. In one embodiment, the Viterbi detector 100 is a time-varying PR4 detector, and the sync mark has the bit pattern given in Table 1 above.

In addition to this embodiment of the Viterbi detector 100 being pruned like the FIG. 7A Viterbi detector, the sample clock is synchronized to the sync mark such that the detector 100 is time varying. More specifically, referring to Table 1, the logic 0's and 1's of the sync mark always come in pairs. Therefore, at every other sample time, the only possible states of the sync mark are S0 or S3. Consequently, by identifying the first sample of the sync mark and configuring the detector 100 such that this first sample is aligned with the sample time k+1 of the trellis, the detector "knows" that at k and k+2 only states S0 and S3 are possible. Therefore, one can eliminate all branches entering states S1 and S2 at sample times k and k+2. But because the trellis between k and k+1 differs from the trellis between k+1 and k+2, the detector 100 is said to be time varying because the trellis depends on the sample time. Even so, because there are only four branches between the states at each consecutive sample time, the time-varying Viterbi detector is often less complex and more robust than the non-time-varying Viterbi detector discussed above in conjunction with FIG. 7A.

Furthermore, like the FIG. 7A Viterbi detector, this embodiment of the Viterbi detector 100 can recover the sync mark regardless of its polarity, and thus regardless of the head-connection polarity. Specifically, the trellis is symmetrical about the imaginary horizontal axis 120 between states S1 and S2. One may notice that because the sync mark of Table 1 has pairs and only pairs of logic 1's, the branches 122 and 124 can also be eliminated because the sync mark cannot have the state S3 at sample time k+1. But removing the branches 122 and 124 would destroy the symmetry about the imaginary axis 120, and would thus render the Viterbi detector 100 polarity dependent. That is, if the head-connection polarity were inverted, the detector 100 would be unable to recover the sync mark. Consequently, the servo circuit 60 would be unable to compensate for the inverted head-connection polarity.

Figure 7C:
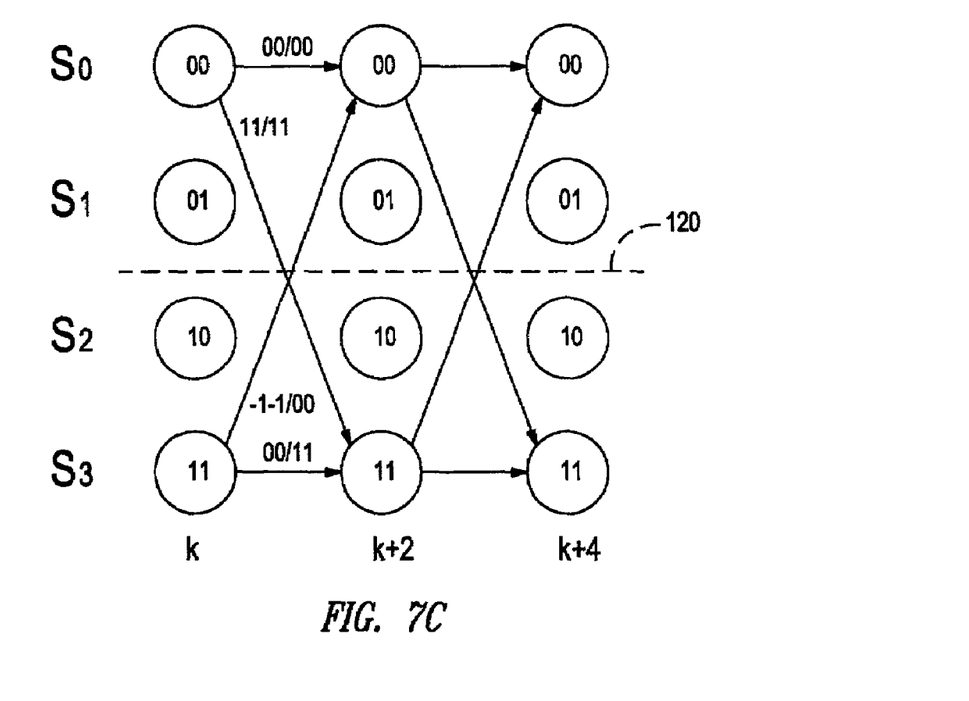
FIG. 7C is a two-sample-at-a-time version of the trellis diagram of FIG. 7B.

FIG. 7C is a two-sample-at-a-time version of the one-sample-at-a-time trellis diagram of FIG. 7B. Specifically, in this embodiment the sample circuit 76, the Viterbi detector 78, and the Viterbi detector 100 process two samples of the servo signal at a time. Therefore, the trellis of FIG. 7C is merely the trellis of FIG. 7B modified to reflect that the Viterbi detector 100 processes two samples at a time. Furthermore, the Viterbi detector 100 is non-time-varying when it processes two samples at a time.

In one embodiment, the two-sample-at-a-time Viterbi detector 100 calculates a difference metric instead of path metrics, and updates the contents of the path history registers 102 based on the difference metric. Consequently, the Viterbi detector 100 can include circuitry that is less complex than would be needed if it calculated path metrics.

The calculation of the difference metric is derived from the following PR4 path-metric equations, which use the following variables: PM00 equals the path metric for the state S0, PM11 equals the path metric for the state S1, Yf equals the first sample of a pair of samples (corresponds to k, k+2, k+4), Ys equals the second sample of a pair 10 of samples (corresponds to k+1 and k+3, which are not shown in FIG. 7C), DM equals the difference metric=½(PM00−PM11), and Yk=Yf+Ys. As discussed above, each sample of a pair of samples has the same value. That is each pair of samples is either 00 or 11. Thus, the complexity of the of the Viterbi detector 100 is equivalent to the complexity of a single interleaved PR4 detector.

If $PM00_k < PM11_k + (Yf+1)^2 + (Ys+1)^2$

Then $PM00_{k+1} = PM00_k$

Else $PM00_{k+1} = PM11_k + (Yf+1)^2 + (Ys+1)^2$ (4)

If $PM11_k < PM00_k + (Yf-1)^2 + (Ys-1)^2$

Then $PM11_{k+1} = PM11_k$

Else $PM11_{k+1} = PM00_k + (Yf-1)^2 + (Ys-1)^2$ (5)

Simplifying equations (4) and (5) to eliminate the square terms results in the following corresponding equations:

If $PM00_k < PM11_k + 2Yf + 2Ys30\ 2$

Then $PM00_{k+1} = PM00_k$

Else $PM00_{k+1} = PM11_k + 2Yf2 + 2Ys + 2$ (6)

If $PM11_k < PM00_k - 2Yf - 2Ys + 2$

Then $PM11_{k+1} = PM11_k$

Else $PM11_{k+1} = PM00_k - 2Yf - 2Ys + 2$ (7)

Simplifying equations (6) and (7) by incorporating DM and Yk in the inequalities results in the corresponding equations:

$Yk > DM_k - 1$ (8)

$Yk < DM_k + 1$ (9)

If equation (8) is false and equation (9) is true, then the Viterbi detector 100 updates DM and the path history registers PH00 and PH11 as follows, where 0 is the first (most recent) bit position and n is the last (least recent) bit position of the path registers:

$DM_{k+1} = Yk + 1$ (10)

$PH00\ (0{:}n)_{k+1} = [0, 0, PH11(0{:}n-2)_k]$ (11)

$PH11\ (0{:}n)_{k+1} = [1, 1, PH11(0{:}n-2)_k]$ (12)

That is, the Viterbi detector 100 loads logic 0's into the two most recent bit positions 0 and 1 of PH00 and loads the remaining bit positions 2-n with the contents of the corresponding bit positions 0-n−2 of PH11. Next, the Viterbi detector 100 loads logic 1's into the two most recent bit positions 0 and 1 of PH11 while or after PH11 shifts the contents of its bit positions 0-n–2 into its bit positions 2-n.

If equation (8) is true and equation (9) is false, then the Viterbi detector 100 updates DM and the path history registers PH00 and PH11 as follows:

$$DM_{k+1} = Y_{k-1} \quad (13)$$

$$PH00(0:n)_{k+1} = [0, 0, PH00(0:n-2)_k] \quad (14)$$

$$PH11(0:n)_{k+1} = [1, 1, PH00(0:n-2)_k] \quad (15)$$

That is, the Viterbi detector 100 loads logic 1's into the two most recent bit positions 0 and 1 of PH11 and loads the remaining bit positions 2-n with the contents of the corresponding bit positions 0-n–2 of PH00. Next, the Viterbi detector 100 loads logic 0's into the two most recent bit positions 0 and 1 of PH00 while or after PH00 shifts the contents of its bit positions 0-n–2 into its bit positions 2-n.

If both equations (8) and (9) are true, then the Viterbi detector 100 updates DM and the path history registers PH00 and PH11 as follows:

$$DM_{k+1} = DM_k \quad (16)$$

$$PH00(0:n)_{k+1} = [0, 0, PH00(0:n-2)_k] \quad (17)$$

$$PH11(0:n)_{k+1} = [1, 1, PH11(0:n-2)_k] \quad (18)$$

That is, when both equations (8) and (9) are true, the Viterbi detector 100 loads logic 0's into the two most recent bit positions 0 and 1 of PH00 while or after PH00 shifts the contents of its bit positions 0-n–2 into its bit positions 2-n. Similarly, the Viterbi detector 100 loads logic 1's into the two most recent bit positions 0 and 1 of PH11 while or after PH11 shifts the contents of its bit positions 0-n–2 into its bit positions 2-n.

Equations (8) and (9) cannot both be false.

Figure 8:
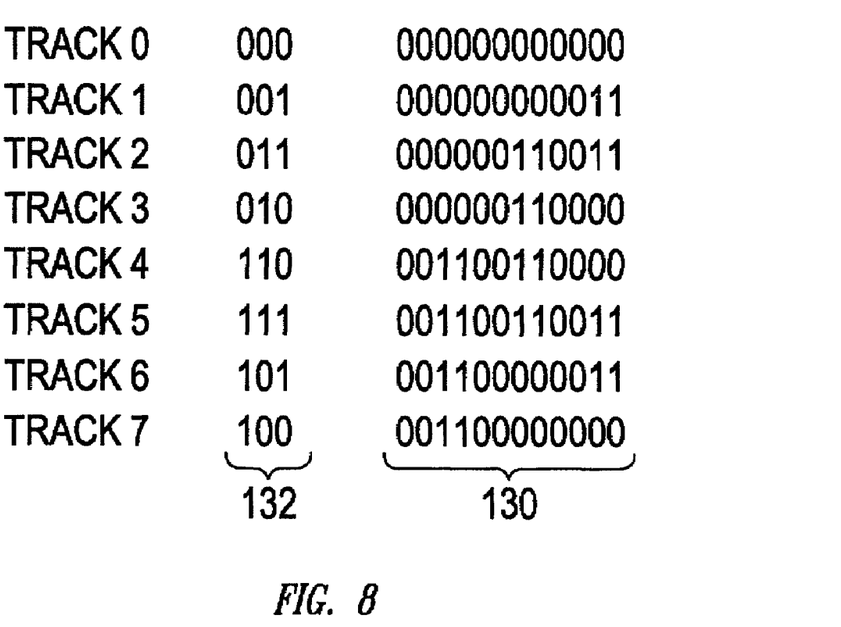
FIG. 8 is a table of Gray coded track identifiers and the corresponding uncoded track identifiers for adjacent tracks on a disk according to an embodiment of the invention.

FIG. 8 is a table of Gray coded bit patterns 130 that form portions of the respective track identifiers 42 (FIG. 3) for eight adjacent tracks 0-7 (FIG. 2), and the corresponding uncoded bit patterns 132 according to an embodiment of the invention. The Gray coded bit patterns 130 include pairs and only pairs of consecutive logic 1's that are separated by no fewer than two consecutive logic 0's; therefore, the bit patterns 130 are compatible with the embodiments of the Viterbi detector 100 discussed above in conjunction with FIGS. 5-7C. Because the bit patterns 130 are compatible with the Viterbi detector 100, they allow the manufacturer to simplify the servo circuit 60 (FIG. 5) by eliminating the Viterbi detector 78 and using the Viterbi detector 100 to recover all of the servo data as discussed above in conjunction with FIGS. 5 and 6. The coding scheme used to generate the Gray coded bit patterns 132 is discussed in commonly owned U.S. Patent Application Ser. No. 60/301,506 entitled "A DATA CODE AND METHOD FOR CODING DATA", which is incorporated by reference.

FIG. 9 is a block diagram of a disk-drive system 200 that incorporates the servo circuit 60 of FIG. 5 according to an embodiment of the invention. The disk-drive system 200 includes a disk drive 202, which includes a read-write head 204, a write channel 206 for generating and driving the head 204 with a write signal, and a write controller 208 for interfacing the write data to the write channel 206. The head 204 may be similar to the head 14 of FIG. 1. The disk drive 202 also includes a read channel 210, which incorporates the servo circuit 60 (FIG. 5) for receiving a servo signal from the head 204 and for recovering servo data therefrom, and for providing the recovered servo data to a head-position circuit 212. The read channel 210 also receives an application-data read signal and recovers application data therefrom. The disk drive 202 also includes a read controller 213 for organizing the read data. Together, the write and read controllers 208 and 213 compose a disk-drive controller 214. The disk drive 202 further includes a storage medium such as one or more disks 215, each of which may contain data on one or both sides and which may be a magnetic, optical, or another type of storage disk. For example, the disks 215 may be similar to the disk 12 of FIG. 1. The head 204 writes/reads the data stored on the disks 215, and is connected to a movable support arm 216, which may be similar to the support arm 16 of FIG. 1. The head-position circuit 212 provides a control signal to a voice-coil motor (VCM) 218, which positionally maintains/radially moves the arm 216 so as to positionally maintain/radially move the head 204 over the desired data tracks on the disks 215. The VCM 218 may be similar to the VCM 18 of FIG. 1. A spindle motor (SPM) 220 and a SPM control circuit 222 respectively rotates the disks 215 and maintains them at the proper rotational speed.

The disk-drive system 200 also includes write and read interface adapters 224 and 226 for respectively interfacing the disk-drive controller 214 to a system bus 228, which is specific to the system used. Typical system busses include ISA, PCI, S-Bus, Nu-Bus, etc. The system 200 typically has other devices, such as a random access memory (RAM) 230 and a central processing unit (CPU) 232 coupled to the bus 228.

From the foregoing it will be appreciated that, although specific embodiments of the invention have been described herein for purposes of illustration, various modifications may be made without deviating from the spirit and scope of the invention.

What is claimed is:

1. A head connection polarity detector, comprising:
   a circuit operable to recover servo data from a servo signal generated by an electromagnetic read write head that is coupled to the circuit, the electromagnetic read write head having a connection polarity, the servo signal having a phase that represents the connection polarity;
   a determinator coupled to the circuit and operable to determine from the recovered servo data whether the phase of the servo signal is reversed.

2. The detector of claim 1 wherein:
   the circuit is operable to recover a servo synchronization mark from the servo signal; and
   the determinator is operable to determine the phase of the servo signal from the recovered servo synchronization mark.

3. The detector of claim 1 wherein the determinator is operable to generate a signal that indicates the determined phase of the servo signal.

4. The detector of claim 1 wherein the circuit comprises a Viterbi detector.

5. The detector of claim 1 wherein the circuit is operable to recover the servo data from the servo signal based upon the determination of the connection polarity regardless of the connection polarity.

6. A synchronization mark and head connection polarity detector, comprising:
   a Viterbi detector operable to recover a synchronization mark from samples of a servo signal generated by an electromagnetic read head that is coupled to the Viterbi detector, the electromagnetic read head having a connection polarity; and
   a comparator coupled to the Viterbi detector and operable to determine if the connection polarity of the electromagnetic read head is incorrect by comparing the recovered synchronization mark to a reference synchronization mark.

7. The detector of claim 6 wherein the comparator is operable to generate a signal that indicates the determined connection polarity.

8. The detector of claim 6 wherein the Viterbi detector is operable to recover the synchronization mark from the servo signal regardless of the connection polarity of the read head.

9. The detector of claim 6 wherein:
the synchronization mark has pairs and only pairs of consecutive logic 0's and logic 1's; and
the Viterbi detector comprises,
a recovery circuit operable to recover the synchronization mark from the samples of the servo signal by,
for each pair of samples, calculating a difference between path metrics for possible states 00 and 11 of the synchronization mark, and
determining a surviving path from the difference, the synchronization mark lying along the surviving path.

10. The detector of claim 6 wherein the comparator is operable to determine the connection polarity by:
comparing the recovered synchronization mark to the reference synchronization mark on a bit by bit basis;
determining that the connection polarity equals a first polarity if the number of mismatching bits is less than or equal to a first predetermined threshold; and
determining that the connection polarity equals a second polarity if the number of mismatching bits is greater than or equal to a second predetermined threshold.

11. The detector of claim 6 wherein the comparator is operable to determine the connection polarity by:
comparing the recovered synchronization mark to the reference synchronization mark on a bit by bit basis;
determining that the connection polarity is positive if the number of mismatching bits is less than or equal to a first predetermined threshold; and
determining that the connection polarity is negative if the number of mismatching bits is greater than or equal to a second predetermined threshold.

12. A servo channel, comprising:
a sampling circuit coupled to receive and operable to generate samples of a servo signal that represents a servo synchronization mark and that has a phase that represents a connection polarity of an electromagnetic read head set during installation; and
a synchronization mark and polarity detector coupled to the sampling circuit and comprising,
a first Viterbi detector operable to recover the synchronization mark from the samples of the servo signal; and
a comparator coupled to the first Viterbi detector and operable to determine if the phase of the servo signal is reversed based on the recovered synchronization mark.

13. The servo channel of claim 12 wherein:
the comparator is coupled to the sampling circuit; and
the sampling circuit is operable to generate the samples of the servo signal having a desired phase.

14. The servo channel of claim 12 wherein:
the comparator is coupled to the sampling circuit; and
if the determined phase is opposite to a desired phase, then the sampling circuit is operable to invert the samples of the servo signal.

15. The servo channel of claim 12 wherein:
the comparator is operable to generate a phase signal that indicates the determined phase; and
the sampling circuit is coupled to the phase determinator and is operable to generate the samples of the servo signal having a desired phase in response to the phase signal.

16. The servo channel of claim 12 wherein the phase of the servo signal represents a connection polarity between the sampling circuit and a read head that generates the servo signal.

17. A servo channel, comprising:
a sampling circuit coupled to receive and operable to generate samples of a servo signal that represents a servo synchronization mark and that has a phase that represents a connection polarity of an electromagnetic read head set during installation; and
a synchronization mark and polarity detector coupled to the sampling circuit and comprising,
a first Viterbi detector operable to recover the synchronization mark from the samples of the servo signal; and
a comparator coupled to the first Viterbi detector and operable to determine if the phase of the servo signal is reversed based on the recovered synchronization mark;
wherein the servo signal also represents servo data other than the synchronization mark; and
a second Viterbi detector coupled to the sampling circuit and operable to recover the other servo data from the samples of the servo signal.

18. A servo channel, comprising:
a sampling circuit coupled to receive and operable to generate samples of a servo signal that represents a binary sequence that includes a servo synchronization mark and other servo data, the servo signal having a phase that represents a connection polarity of an electromagnetic read head set during installation; and
a detector coupled to the sampling circuit and comprising,
a Viterbi detector operable to recover the synchronization mark and the other servo data from the samples of the servo signal; and
a comparator coupled to the Viterbi detector and operable to determine if the phase of the servo signal is reversed based on the recovered synchronization mark.

19. The servo channel of claim 18 wherein:
the comparator is coupled to the sampling circuit; and
if the determined phase is opposite to a desired phase, then the sampling circuit is operable to invert the samples of the servo signal.

20. The servo channel of claim 18 wherein:
the synchronization mark and other servo data include pairs and only pairs of consecutive logic 0's and logic 1's; and
the Viterbi detector is operable to recover the synchronization mark and servo data from the samples by,
for each pair of samples, calculating a difference between path metrics for two possible states of the binary sequence, and
determining a surviving path from the difference, the binary sequence lying along the surviving path.

21. A disk-drive system, comprising:
a data-storage disk having a surface and operable to store a servo synchronization mark and other servo data;
a motor coupled to and operable to rotate the disk;
a read head operable to generate a servo signal that has a phase and that represents the synchronization mark and the other servo data;

a read-head positioning assembly operable to move the read head over the surface of the disk; and a servo channel coupled to the read head, the servo channel comprising,     a sampling circuit operable to generate samples of the servo signal and to adjust a phase of the samples to a desired value in response to a determined phase of the servo signal,     a synchronization mark and coupling polarity detector coupled to the sampling circuit and comprising,         a first Viterbi detector operable to recover the synchronization mark from the samples of the servo signal, and         a comparator coupled to the first Viterbi detector and operable to determine the phase of the servo signal from the recovered synchronization mark and to provide the determined phase to the sampling circuit, and     a second Viterbi detector coupled to the sampling circuit and operable to recover the other servo data from the samples of the servo signal.

22. A disk-drive system, comprising:

a magnetic data-storage disk having a surface and operable to store a servo synchronization mark and other servo data;

a motor coupled to and operable to rotate the disk;

a read head having a connection polarity and operable to generate a servo signal that represents the synchronization mark and the other servo data, the servo signal having a phase that represents the connection polarity;

a read-head positioning assembly operable to move the read head over the surface of the disk; and a servo channel coupled to the read head, the servo channel comprising,     a sampling circuit operable to generate samples of the servo signal, and     a Viterbi detector operable to recover the synchronization mark and other servo data from the samples of the servo signal regardless of the phase of the servo signal.

23. A method, comprising:

generating a servo signal with an electromagnetic read head, the servo signal representing servo data and having a phase that represents a connection polarity of the electromagnetic read head set during installation of the read head;

recovering the servo data from the servo signal; and determining whether the phase of the servo signal is reversed based on the recovered servo data.

24. The method of claim 23 wherein:

the servo data includes a synchronization mark;

the determining comprises determining the phase of the servo signal from the recovered synchronization mark.

25. The method of claim 23, further comprising generating a signal that indicates the determined phase of the servo signal.

26. The method of claim 23, further comprising adjusting the phase of the servo signal to a desired value if the determined phase has an undesired value.

27. The method of claim 23, further comprising:

wherein the servo data includes a synchronization mark; and the determining comprises,     comparing the recovered synchronization mark to an ideal synchronization mark on a bit by bit basis,     determining that the servo signal is in phase if the number of mismatching bits is less than or equal to a first predetermined threshold, and     determining that the servo signal is out of phase if the number of mismatching bits is greater than or equal to a second predetermined threshold.

28. A method, comprising:

sampling a servo signal from an electromagnetic read head, the servo signal having a phase that represents a connection polarity of the read head; and recovering servo data from the servo signal regardless of the phase of the servo signal.

29. A method, comprising:

sampling a servo signal from an electromagnetic read head, the servo signal having a phase that represents a connection polarity of the read head;

determining whether the phase of the servo signal is reversed or not reversed;

generating non-inverted samples of the servo signal if the phase is not reversed; and generating inverted samples of the servo signal if the phase is reversed.

\* \* \* \* \*

UNITED STATES PATENT AND TRADEMARK OFFICE
CERTIFICATE OF CORRECTION

| | | |
|---|---|---|
| PATENT NO. | : 7,830,630 B2 | Page 1 of 1 |
| APPLICATION NO. | : 09/993779 | |
| DATED | : November 9, 2010 | |
| INVENTOR(S) | : Hakan Ozdemir | |

It is certified that error appears in the above-identified patent and that said Letters Patent is hereby corrected as shown below:

Cover Page, insert:
Item --(63) The present patent claims priority to United States Provisional Patent Application Serial No. 60/301,490, filed June 28, 2001.--

Signed and Sealed this
Twenty-second Day of March, 2011

David J. Kappos
*Director of the United States Patent and Trademark Office*